United States Patent [19]
Eissa

[11] Patent Number: 5,828,132
[45] Date of Patent: Oct. 27, 1998

[54] SEMICONDUCTOR DEVICE HAVING PERFLUORINATED AND NON-FLUORINATED PARYLENE INTERMETAL DIELECTRIC

[75] Inventor: Mona Eissa, Plano, Tex.

[73] Assignee: Texas Instruments Incorporated, Dallas, Tex.

[21] Appl. No.: 821,875

[22] Filed: Mar. 21, 1997

[51] Int. Cl.$^6$ .................................................. H01L 23/48
[52] U.S. Cl. ............................................ 257/759; 257/642
[58] Field of Search .................................... 257/642, 759, 257/40, 374, 501; 438/359, 981; 361/311, 312

[56] References Cited

U.S. PATENT DOCUMENTS 5,268,202  12/1993  You et al. ............................ 427/255.6
5,616,959   4/1997  Jeng ........................................ 257/759

*Primary Examiner*—Olik Chaudhuri
*Assistant Examiner*—Nathan K. Kelley
*Attorney, Agent, or Firm*—Carlton H. Hoel; W. James Brady; Richard L. Donaldson

[57] ABSTRACT

A semiconductor device comprising first and second interconnect levels (14) and (16) is described. Mixed polymeric intermetal dielectrics (46), (48) and (50) are used to separate conductive elements (22), (24), (26), (36) and (38), respectively. The intermetal dielectric bodies (46), (48) and (50) comprise a mixture of perfluorinated and non-fluorinated parylene.

6 Claims, 2 Drawing Sheets

SEMICONDUCTOR DEVICE HAVING PERFLUORINATED AND NON-FLUORINATED PARYLENE INTERMETAL DIELECTRIC

TECHNICAL FIELD OF THE INVENTION

This invention relates in general to the field of electronic devices and more particularly to semiconductor devices having an improved intermetal dielectric and method of formation.

BACKGROUND OF THE INVENTION

As the features sizes of ULSI technology continue to shrink, the intrinsic semiconductor gate performance improves through a higher drive current and lower junction capacitance. However, the interconnect RC time constant increases rapidly because the resistance of metal leads increases with decreasing line width and the interconnect capacitance increases with decreasing spacing between the lines. When minimum feature size is scaled below 0.3 micron, the interconnect delay becomes a major limiting factor of circuit performance.

The replacement of silicon dioxide as an intermetal dielectric with an insulator of lower dielectric constant is a particularly attractive solution since it provides immediate performance improvement through a reduction in capacitance. Prior techniques have used an imbedded polymer integration scheme to improve the interconnect performance through line-to-line capacitance reduction by using polymer only between tightly spaced lines. These gap-filled polymeric materials do not degrade the electromigration performance of standard multilayered titanium nitride and aluminum interconnects.

There are a variety of dielectric materials including pure polymer, spin-on glasses, and porous materials that offer lower values of permittivity than traditional silicon dioxide. One particularly useful polymer which exhibits extremely low permittivity values and yet exhibits thermal stability is fluorinated parylene, commonly referred to as parylene-F. Parylene-F exhibits a dielectric constant on the order of 2.3. This is in comparison to a dielectric constant of on the order of 2.7 for non-fluorinated parylene, commonly referred to as parylene-N, and a dielectric constant of on the order of 4.5 for undoped silicon dioxide.

Although parylene-F performs as an excellent intermetal dielectric, it is extremely difficult to work with because of the difficulty in forming the precursor dimer AF4 which is the reactant needed to the formation of parylene-F. Methods of forming the necessary precursor dimer are extremely difficult to control and have correspondingly low yield rates. As such, the precursor dimer for parylene-F is not commercially available and the user of parylene-F as an intermetal dielectric is not commercially feasible.

SUMMARY OF THE INVENTION

Accordingly, a need has arisen for an improved intermetal dielectric which is commercially practical and provides for a low permittivity constant while remaining compatible with other processes within a semiconductor device formation.

According to the teachings of the present invention, an intermetal dielectric material is provided that substantially eliminates or reduces problems associated with prior materials and techniques of formation.

According to one embodiment of the present invention, a process for forming a dielectric material is disclosed which comprises the step of sublimating a parylene dimer. The resulting monomers are then exposed to a reactive fluoridating agent. A mixture of perfluorinated and non-fluoridated parylene monomers are then condensed on a substrate to form a polymeric dielectric material.

BRIEF DESCRIPTION OF THE DRAWINGS

A more complete understanding of the teachings of the present invention may be acquired by referring to the accompanying figures in which like reference numbers indicate like features and wherein.

DETAILED DESCRIPTION OF THE INVENTION

Figure 1:
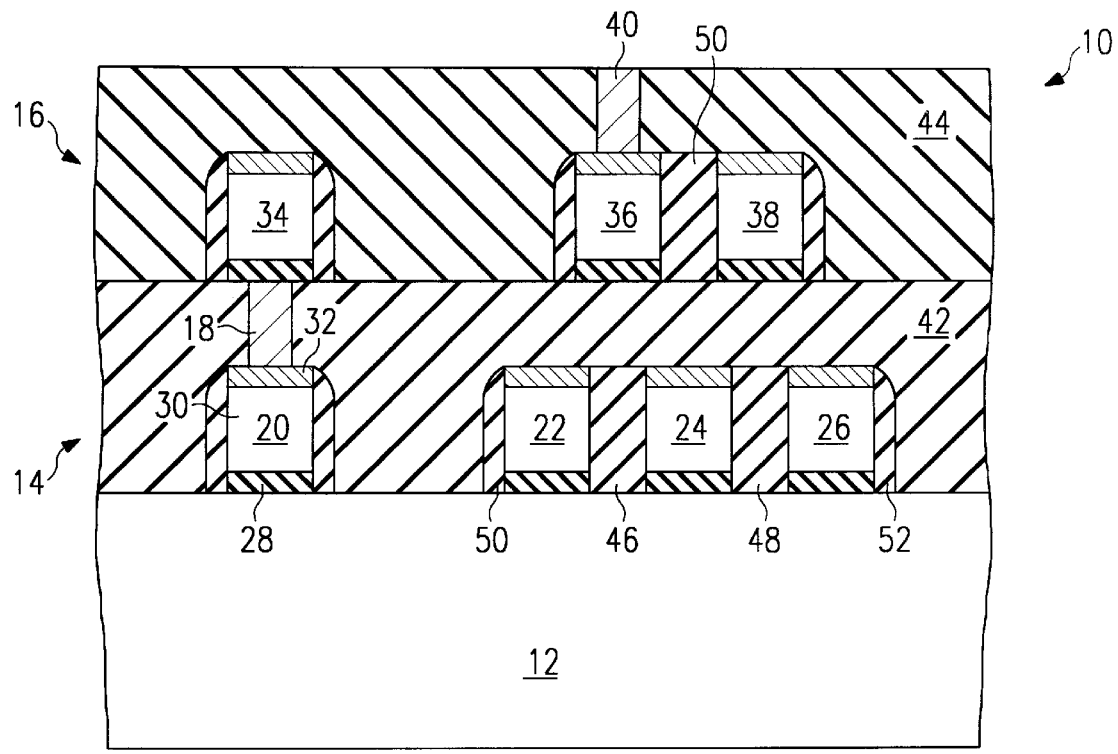
FIG. 1 is an enlarged cross-sectional schematic diagram of a portion of a semiconductor device constructed according to the teachings of the present invention.

Referring to FIG. 1, a semiconductor structure indicated generally at 10 is shown which is formed on the outer surface of a semiconductor substrate 12 which may comprise any suitable semiconductor material such as silicon or gallium arsenide. Semiconductor structure 10 comprises a first level of conductive interconnects indicated generally at 14 and a second level of conductive interconnects indicated generally at 16. Level 14 and level 16 are interconnected by conductive vias represented by via 18 shown in FIG. 1. Level 14 comprises a network of conductive elements represented by conductive elements 20, 22, 24 and 26. Each of the conductive elements 20, 22, 24 and 26 comprise a composite structure of metal and nitride. For example, conductive element 20 comprises a first level of titanium nitride 28. A layer of aluminum 30 is disposed outwardly from layer 28. Finally, an outer layer of titanium nitride 32 is disposed outwardly from layer 30. Each of conductive elements 20, 22, 24 and 26 are constructed of such a composite formation.

Similarly, layer 16 is comprised of a network of conductors represented by conductive elements 34, 36, and 38. Level 16 may be connected to other outer layers of conductors or devices by conductive via 40. Conductive elements 34, 36 and 38 are each comprised of composite structures similar to that described with reference to element 20 previously.

Level 14 is separated from level 16 and some elements within level 14 are separated from one another by a silicon dioxide layer 42. Similarly, level 16 is separated from layers formed outwardly from level 16 and certain of the elements within layer 16 or separated from one another by a second silicon dioxide layer 44.

According to the teachings of the present invention, conductive elements which are spaced apart by the minimum geometric spacing are not separated by silicon dioxide. For example, conductive elements 22 and 24 are spaced apart by an elongate polymer body 46 shown in FIG. 1. Similarly, conductive elements 24 and 26 are spaced apart by an elongate polymer body 48. Finally, conductive elements 36 and 38 are spaced apart by an elongate polymer body 50. Polymer bodies 46, 48 and 50 comprise the intermetal dielectric materials, the formation of which will be described herein.

In general, bodies 46, 48 and 50 are formed of a mixture of per-fluorinated and non-fluorinated parylene which exhibits a dielectric constant on the order of 2.3. This dielectric constant and the overall performance of the mixed polymeric material is comparable to a fully fluorinated parylene, commonly referred to as parylene-F. As will be described herein, the mixed polymer material is much easier to form and, as such, is a commercially feasible intermetal dielectric.

The polymer bodies 46, 48 and 50 and formed by a conformal deposition of the mixed polymeric material. This deposition process is followed by an etch-back process. These processes may result in the residual sidewall bodies shown in FIG. 1 and exemplified by residual sidewall bodies 50 and 52 disposed outwardly from conductive elements 22 and 26 respectively.

Figure 2:
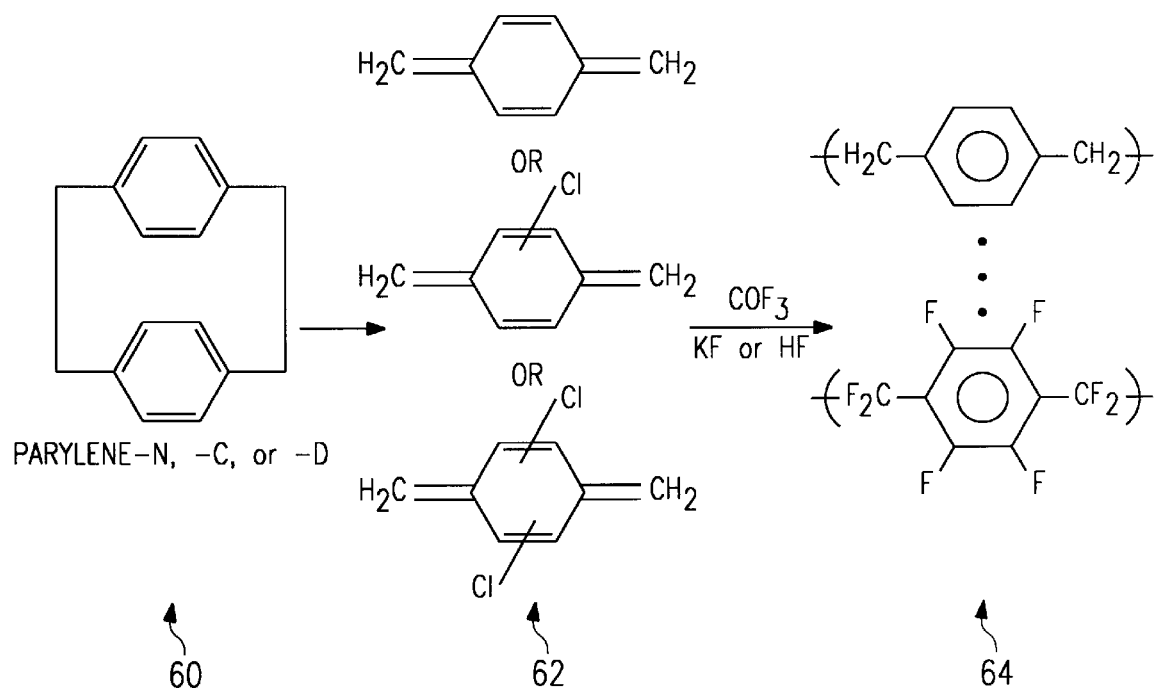
FIG. 2 is a diagram illustrating the chemical processes used to create the intermetal dielectric used in the structures and methods of the present invention.

FIG. 2 is a diagram which illustrates the chemical processes that are used to form the mixed polymeric material used in the present invention. Referring to FIG. 2, a conventional parylene-N, parylene-C or parylene-D dimer indicated at 60 is decomposed to create the reactive monomers indicated generally at 62. These reactive monomers are subjected to an environment which includes fluoride-carrying agents. These fluoride-carrying agents may comprise, for example, cobalt fluoride ($CoF_3$)I potassium fluoride (KF), or hydrogen fluoride (HF). When the monomers associate polymer in the flouride-rich environment, the resulting polymer is a mixture of per-fluorinated and non-fluorinated parylene. This mixture is indicated at 64 in FIG. 2.

Figure 3:
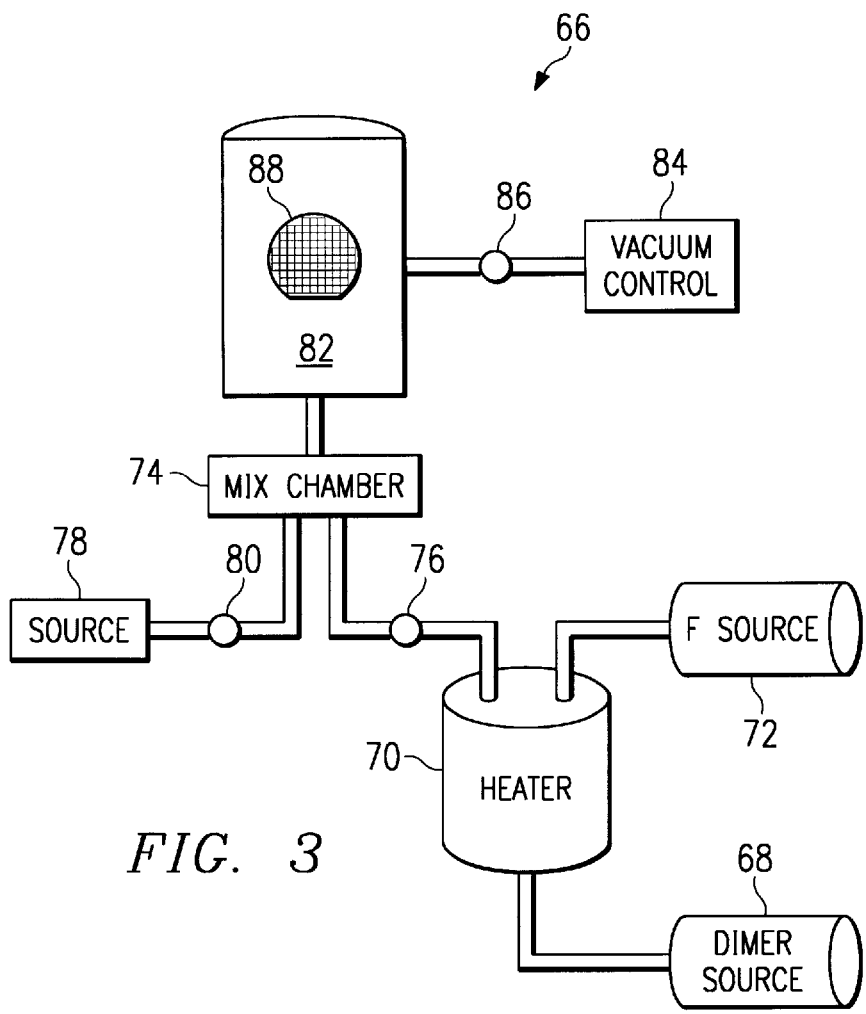
FIG. 3 is a schematic illustration of a chemical vapor deposition system which may be used to construct the semiconductor devices according to the teachings of the present invention.

Referring to FIG. 3, a processing system indicated generally at 66 is shown. System 66 is under vacuum base pressure of less than 10 millitor. System 66 comprises a dimer source 68 which is connected to a furnace 70. Furnace 70 also comprises a solid fluoride source 71, which introduces into furnace 70 a solid source of fluoride which may comprise, for example, cobalt fluoride or potassium fluoride. In the alternative, a gaseous fluoridating agent such as hydrogen fluoride may introduced from an HF source 72 through a valve 73 to a mix chamber 74. The dimer source 68 supplies the parylene-N, parylene-C or parylene-D dimer vapor by subliming the dimer by heating the dimer to on the order of 120°–150° C. Furnace 70 is heated to on the order of 500°–580° C. to disassociate the dimers and create the mixture of monomers and reactive fluoride compounds. This mixture is then passed to mixing chamber 74 through a valve 76. Other materials, such as dopants or other reactive or non-reactive agents may be supplied to the mix chamber 74 from a source 78 through a valve 80. As discussed previously, if a gaseous fluoride source such as HF source 72 is used, the mixing chamber 74 is used to fluoridate the reactive monomers.

The mixing chamber 74 is connected to a chamber 82. The entire system 66 is kept at a base pressure of less than 10 millitor. The pressure within chamber 82 increases during the deposition process but does not exceed 100 millitor. This pressure can be controlled by the temperature of dimer source 68 or by controlling the mass flow of the vapor entering the chamber 82. A chuck 83 within chamber 82 is capable of being temperature controlled between −80° C. and 80° C. The chuck 83 inside the chamber 82 is cooled or heated to between −40° and 10° C. to enable the monomers and fluoride to condense on the surface of a semiconductor wafer 88 placed on the chuck 83 within chamber 82.

The dimer source 68 provides an environment where the solid dimer can sublimate to a vapor state before being passed into furnace 70. The furnace 70 then disassociates the vapor dimer to the required reactive monomers. The fluoride source 72 then introduces the fluorinating agent into the furnace 70. The resulting reactive mixture is then condensed to form a mixture of per-fluorinated and non-fluorinated parylene on the outer surface of wafer 88 within CVD chamber 82. This mixed polymeric material exhibits a dielectric constant on the order of 2.3. It is thus comparable to the expensive and impractical parylene-F material. In addition, the mixed polymer intermetal dielectric of the present invention maintains good dimensional stability, high thermal stability, ease of pattern and etch for sub-micron features, low moisture absorption and permeation, good adhesion, low stress, good etch selectivity to metal, high thermal conductivity, high dielectric strength/low leakage current and good gap filling and planarization capability.

Although the present invention has been described in detail, t should be understood that various changes, alterations, substitutions and modifications may be made to the teachings described herein without departing from the spirit and scope of the present invention which is solely defined by the appended claims.

What is claimed is:

1. A dielectric material comprising a copolymer of per-fluorinated parylene and non-fluorinated parylene.

2. A semiconductor device, comprising:

first and second elongated metal conductors disposed adjacent one another; and an elongated intermetal dielectric body disposed between the first and second conductors and comprising a copolymer of per-fluorinated and non-fluorinated parylene.

3. The semiconductor device of claim 2 wherein the intermetal dielectric material is formed by introducing a fluoridating agent into a heater with parylene monomers.

4. The device of claim 3 wherein the fluoridating agent comprises cobalt fluoride.

5. The device of claim 3 wherein the fluoridating agent comprises potassium fluoride.

6. The device of claim 3 wherein the fluoridating agent comprises hydrogen fluoride.

* * * * *